United States Patent
Su

(10) Patent No.: US 11,272,646 B2
(45) Date of Patent: Mar. 8, 2022

(54) ELECTROMAGNETIC INTERFERENCE (EMI) SHIELDING FILM, CIRCUIT BOARD, AND PREPARATION METHOD FOR EMI SHIELDING FILM

(71) Applicant: Guangzhou FANG BANG Electronic Co., Ltd., Guangzhou (CN)

(72) Inventor: Zhi Su, Guangzhou (CN)

(73) Assignee: GUANGZHOU FANG BANG ELECTRONIC CO., LTD., Guangzhou (CN)

( * ) Notice: Subject to any disclaimer, the term of this patent is extended or adjusted under 35 U.S.C. 154(b) by 840 days.

(21) Appl. No.: 16/067,315

(22) PCT Filed: Mar. 22, 2018

(86) PCT No.: PCT/CN2018/079966
§ 371 (c)(1),
(2) Date: Jun. 29, 2018

(87) PCT Pub. No.: WO2019/174062
PCT Pub. Date: Sep. 19, 2019

(65) Prior Publication Data
US 2021/0176904 A1 Jun. 10, 2021

(30) Foreign Application Priority Data
Mar. 14, 2018 (CN) .......................... 201810210841.3

(51) Int. Cl.
*H05K 9/00* (2006.01)
*H05K 1/02* (2006.01)

(52) U.S. Cl.
CPC ......... *H05K 9/0088* (2013.01); *H05K 1/0218* (2013.01); *H05K 2201/0715* (2013.01)

(58) Field of Classification Search
CPC ............... H05K 9/0088; H05K 1/0218; H05K 2201/0715
See application file for complete search history.

(56) References Cited

U.S. PATENT DOCUMENTS

| 5,226,210 A | * | 7/1993 | Koskenmaki | ......... B29C 70/086 174/388 |
| 2005/0040535 A1 | * | 2/2005 | Kawata | ................. C23C 18/165 257/765 |

(Continued)

FOREIGN PATENT DOCUMENTS

| CN | 103763893 A | 4/2014 |
| CN | 104332217 A | 2/2015 |

(Continued)

*Primary Examiner* — Hoa C Nguyen
(74) *Attorney, Agent, or Firm* — Cantor Colburn LLP

(57) ABSTRACT

Provided are an Electromagnetic Interference (EMI) shielding film, a circuit board including the EMI shielding film, and a preparation method for the EMI shielding film. The EMI shielding film includes a shielding layer and an adhesive film layer, wherein the shielding layer includes a first surface and a second surface opposite to each other; the second surface is a rolling uneven surface; convex conductor particles are also formed on the rolling uneven surface; and the second surface of the shielding layer is provided with the adhesive film layer, so the adhesive film layer of the EMI shielding film will extrude adhesive materials into recesses of the second surface in a lamination process, the adhesive holding capacity is increased, and delamination and blister of board is unlikely to occur. Moreover, the rolling uneven surface also has conductor particles with a certain height, so it can be ensured that the shielding layer smoothly punctures the adhesive film layer in the lamination process, reliable grounding is achieved, and the practicality is strong.

20 Claims, 4 Drawing Sheets

(56) References Cited

U.S. PATENT DOCUMENTS

| | | | |
|---|---|---|---|
| 2012/0164413 A1* | 6/2012 | Hara | B29C 43/003 |
| | | | 428/212 |
| 2017/0277290 A1* | 9/2017 | Murakami | G06F 3/0443 |
| 2019/0261503 A1* | 8/2019 | Haruna | H01R 4/04 |

FOREIGN PATENT DOCUMENTS

| | | |
|---|---|---|
| CN | 105101761 A | 11/2015 |
| CN | 107079611 A | 8/2017 |
| CN | 206650912 U | 11/2017 |
| CN | 208095043 U | 11/2018 |
| JP | 20050311039 A | 11/2005 |
| KR | 1020140093738 | 7/2014 |
| KR | 1020170091576 A | 8/2017 |
| KR | 1020170094134 A | 8/2017 |
| WO | 2016088381 A1 | 6/2016 |

* cited by examiner

```
A shielding layer is formed, wherein the shielding layer
includes a first surface and a second surface opposite to     S1
each other, and the second surface is a rolling uneven
                        surface Conductor particles are formed on the rolling uneven          S2
              surface of the shielding layer An adhesive film layer is formed on the second surface        S3
                    of the shielding layer
```

ELECTROMAGNETIC INTERFERENCE (EMI) SHIELDING FILM, CIRCUIT BOARD, AND PREPARATION METHOD FOR EMI SHIELDING FILM

TECHNICAL FIELD

The disclosure relates to the field of electronics, and more particularly to an Electromagnetic Interference (EMI) shielding film, a circuit board, and a preparation method for an EMI shielding film.

BACKGROUND

With the rapid development of an electronic industry, electronic products further develop to small size, light weight and high assembly density, and greatly promote the development of flexible circuit boards, thereby achieving integration of element device and wire connection. The flexible circuit boards may be widely applied to the industries such as mobile phones, liquid crystal displays, communications and aerospace.

Under the promotion of an international market, a functional flexible circuit board plays a dominant role in a flexible circuit board market. An important indicator for evaluating the functional flexible circuit board is EMI shielding. With the integration of functions of communication equipment such as a mobile phone, internal components thereof are subjected to sharp high frequency and high speed. For example, the mobile phone has a necessary function namely a photography function in addition to an original audio propagation function, a Wireless Local Area Networks (WLAN) function, a Global Positioning System (GPS) function and a networking function have been popularized, and it will inevitably tend to sharp high-frequency and high-speed components in conjunction with the future integration of sensing components. The problems of EMI inside and outside a component, signal transmission attenuation, insertion loss and jitter caused by high-frequency and high-speed drive are gradually severe.

At present, a shielding film commonly used for an existing circuit board includes a shielding layer and an adhesive film layer, wherein the shielding layer mainly has a rough surface formed on an even metal surface, the rough surface being used for puncturing the adhesive film layer during lamination, so as to contact a ground layer of the circuit board. For the above-mentioned structure, the shielding layer punctures the adhesive film layer by means of the rough surface during lamination and is grounded to and conducted with the ground layer of the circuit board. Since only recesses of the rough surface of the shielding layer can hold adhesives in a lamination process, the adhesive holding capacity is small, and delamination and blister of board is easily caused, thereby resulting in grounding failure so as not to dissipates interference charges.

SUMMARY

An objective of the embodiments of the disclosure is to provide an EMI shielding film, a circuit board, and a preparation method for an EMI shielding film, which can effectively solve the problems where delamination and blister of board at high-temperature is easily caused by insufficient of adhesive holding capacity, are strong puncture force and high peel strength, and avoid delamination and blister of board.

To achieve the above-mentioned objective, the embodiments of the disclosure provide an EMI shielding film, including a shielding layer and an adhesive film layer, wherein the shielding layer includes a first surface and a second surface opposite to each other; the second surface is a rolling uneven surface; convex conductor particles are also formed on the rolling uneven surface; and the second surface of the shielding layer is provided with the adhesive film layer.

As an improvement of the above-mentioned solution, the height of the conductor particles is within a range of 0.1 μm to 30 μm.

As an improvement of the above-mentioned solution, the thickness of the shielding layer is within a range of 0.1 μm to 45 μm, and the thickness of the adhesive film layer is within a range of 1 μm to 80 μm.

As an improvement of the above-mentioned solution, the rolling uneven surface of the shielding layer includes a plurality of protrusions and recesses, the conductor particles being gathered on the protrusions.

As an improvement of the above-mentioned solution, the adhesive film layer includes an adhesion layer containing conductive particles.

As an improvement of the above-mentioned solution, the adhesive film layer includes an adhesion layer not containing conductive particles.

As an improvement of the above-mentioned solution, the shielding layer includes one or more of a metal shielding layer, a carbon nano tube shielding layer, a ferrite shielding layer and a graphene shielding layer.

As an improvement of the above-mentioned solution, the metal shielding layer includes a monometallic shielding layer and/or an alloy shielding layer, wherein the monometallic shielding layer is made of any one of aluminum, titanium, zinc, iron, nickel, chromium, cobalt, copper, silver and gold, and the alloy shielding layer is made of any two or more of aluminum, titanium, zinc, iron, nickel, chromium, cobalt, copper, silver and gold.

As an improvement of the above-mentioned solution, the EMI shielding film further comprises a protective film layer, the protective film layer being formed on the first surface of the shielding layer.

Compared with the related art, the EMI shielding film provided by the embodiments of the disclosure has the advantages of reliable grounding and strong practicality due to the fact that a second surface of a shielding layer is a rolling uneven surface, convex conductor particles are also formed on the rolling uneven surface and it can be ensured that the shielding layer smoothly punctures an adhesive film layer in a lamination process.

The embodiments of the disclosure also provide a circuit board. The circuit board includes a printed circuit board and the EMI shielding film according to any one of the above-mentioned contents, wherein the EMI shielding film is laminated with the printed circuit board through an adhesive film layer; and conductor particles on a second surface of the shielding layer puncture the adhesive film layer and extend to a ground layer of the printed circuit board.

Compared with the related art, the circuit board provided in the embodiments of the disclosure adopts the EMI shielding film according to any one of the above-mentioned contents, so the adhesive film layer of the EMI shielding film will extrude adhesive materials into recesses of the second surface in a lamination process, the adhesive holding capacity is increased, and delamination and blister of board is unlikely to occur. Moreover, the rolling uneven surface also has conductor particles with a certain height, so it can be ensured that the shielding layer smoothly punctures the adhesive film layer in the lamination process, reliable grounding is achieved, and the practicality is strong.

The embodiments of the disclosure also correspondingly provide a preparation method for an EMI shielding film, including the following steps.

S1. A shielding layer is formed, wherein the shielding layer includes a first surface and a second surface opposite to each other, and the second surface is a rolling uneven surface.

S2. Conductor particles are formed on the rolling uneven surface of the shielding layer.

S3. An adhesive film layer is formed on the second surface of the shielding layer.

As an improvement of the above-mentioned solution, the shielding layer is formed in S1 by means of the following manners.

A protective film layer is formed on a carrier film, and a shielding layer is formed on the protective film layer, wherein the first surface is laminated with the protective film layer. Or, a shielding layer is formed on the surface of a peelable layer with a carrier, a protective film layer is formed on the shielding layer, and the peelable layer with a carrier is peeled, wherein a first surface of the shielding layer is laminated with the protective film layer.

As an improvement of the above-mentioned solution, the step that a shielding layer is formed on the protective film layer or the peelable layer with a carrier specifically includes:

a shielding layer is formed on an even surface or uneven surface of the protective film layer or the peelable layer with a carrier, and the shielding surface is subjected to surface treatment by means of one or more processes of physical roughening, chemical plating, physical vapor deposition, chemical vapor deposition, evaporation plating, splutter plating, electroplating and mixed plating; or, a shielding layer with a certain rolling degree is formed on an uneven surface of the protective film layer or the peelable layer with a carrier.

As an improvement of the above-mentioned solution, the step that conductor particles are formed on the rolling uneven surface of the shielding layer in S2 specifically includes:

conductor particles are formed on the rolling uneven surface of the shielding layer by means of one or more processes of physical roughening, chemical plating, physical vapor deposition, chemical vapor deposition, evaporation plating, splutter plating, electroplating and mixed plating.

As an improvement of the above-mentioned solution, the step that an adhesive film layer is formed on the second surface of the shielding layer in S3 specifically includes:

a release film is coated with an adhesive film layer, and then the adhesive film layer is laminated and transferred to the second surface of the shielding layer so as to form the adhesive film layer on the second surface of the shielding layer; or, the second surface of the shielding layer is directly coated with an adhesive film layer so as to form the adhesive film layer on the second surface of the shielding layer.

Compared with the related art, the preparation method for an EMI shielding film provided in the embodiments of the disclosure has the advantages that conductor particles are formed on a rolling uneven surface of a shielding layer and then an adhesive film layer on a second surface of the shielding layer, so that the EMI shielding film according to any one of the above-mentioned contents may be formed; and the rolling uneven surface also has conductor particles with a certain height, so it can be ensured that the shielding layer smoothly punctures the adhesive film layer in a lamination process, reliable grounding is achieved, and the practicality is strong.

DETAILED DESCRIPTION OF THE EMBODIMENTS

The technical solutions in the embodiments of the disclosure will be clearly and completely described herein below with the drawings in the embodiments of the disclosure. Obviously, the described embodiments are only part of the embodiments of the disclosure, not all of the embodiments. On the basis of the embodiments of the disclosure, all other embodiments obtained on the premise of no creative work of a person of ordinary skill in the art fall within the scope of protection of the disclosure.

Figure 1:
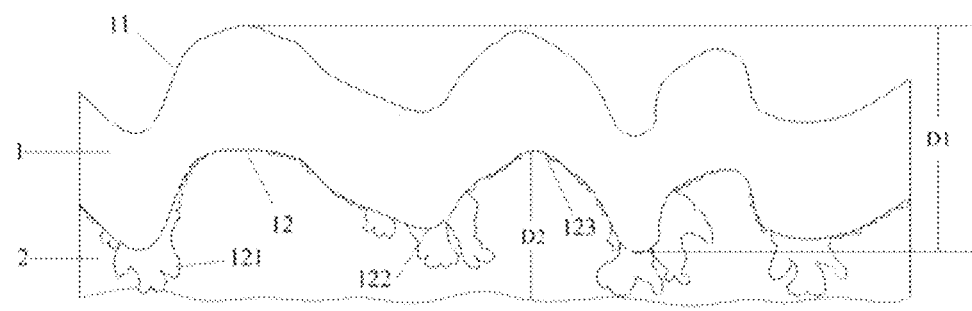
FIG. 1 is a structure diagram of an EMI shielding film in Embodiment 1 of the disclosure.

Referring to FIG. 1, a structure diagram of an EMI shielding film in Embodiment 1 of the disclosure is shown.

As shown in FIG. 1, the EMI shielding film includes a shielding layer 1 and an adhesive film layer 2, wherein the shielding layer 1 includes a first surface 11 and a second surface 12 opposite to each other; the second surface 12 is a rolling uneven surface; convex conductor particles 121 are also formed on the rolling uneven surface 12; the second surface 12 of the shielding layer is provided with the adhesive film layer 2; and the adhesive film layer 2 includes an adhesion layer not containing conductive particles.

Figure 2:
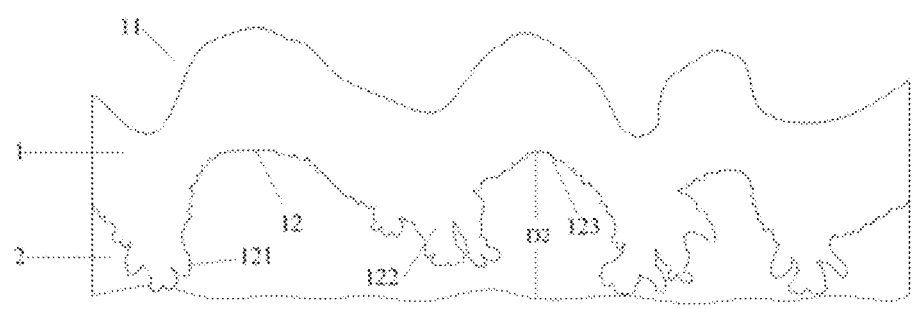
FIG. 2 is a structure diagram of another EMI shielding film in Embodiment 1 of the disclosure.

In specific implementation, as shown in FIG. 1, the shielding layer 1 may be first formed, and then the conductor particles 121 are formed on the second surface 12 of the shielding layer 1 by means of other processes. Of course, as shown in FIG. 2, the shielding layer 1 and the conductor particles 121 may be of an integrated structure formed by a one-time forming process.

Preferably, the conductor particles 121 may be spaced from an outer surface of the adhesive film layer 2 by a certain distance, or may contact the outer surface of the adhesive film layer 2 or extend beyond the outer surface of the adhesive film layer 2. In addition, the outer surface of the adhesive film layer 2 may be a non-rolling even surface, or may be a gently-rolling uneven surface.

The first surface 11 of the shielding layer 1 may be a surface of any shape. For example, the first surface may be an even surface or may be a rolling uneven surface matched with the second surface 12 as shown in FIG. 1 or other rough surfaces. In the drawings of the disclosure, the first surface 11 is a rolling uneven surface matched with the second surface 12, and first surfaces of any other shapes fall within the scope of protection of the disclosure.

It should be noted that the shape of the conductor particles 121 as shown in FIG. 1 is only exemplary. Due to the difference in technological means and parameters, the conductor particles 121 may also be of other shapes such as clusters, hanging ice, stalactite or dendrite. In addition, the conductor particles 121 in the disclosure are not limited by the drawings and the above-mentioned shapes. Any conductor particles with puncture and conducting functions fall within the scope of protection of the disclosure.

Specifically, the second surface 12 is a rolling uneven surface, including a plurality of protrusions 123 and recesses 122, the conductor particles 121 being preferably gathered on the protrusions 122. So, the shielding layer 1 is more likely to puncture the adhesive film layer 2 in a lamination process, thereby achieving reliable grounding and improving the quality of EMI shielding.

Based on the above-mentioned structure, since the second surface 12 of the shielding layer 1 is a rolling uneven surface, the adhesive film layer 2 will extrude adhesives at the conductor particles 121 of the protrusions 122 of the second surface into the recesses 123 of the second surface in the lamination process, and the phenomenon of grounding failure caused by small adhesive holding capacity and delamination and blister of board is avoided. Moreover, the rolling uneven surface also has conductor particles 121 with a certain height, so it can be ensured that the shielding layer 1 smoothly punctures the adhesive film layer 2 in the lamination process, and the practicality is strong. The adhesive film layer 2 is an adhesion layer not containing conductive particles, so that the insertion loss of a circuit board during use can be reduced, the shielding efficiency is improved, and the bending performance of the circuit board is improved.

Preferably, the height of the conductor particles 121 is within a range of 0.1 μm to 30 μm.

The thickness of the shielding layer 1 is within a range of 0.1 μm to 45 μm, and the thickness of the adhesive film layer 2 is within a range of 1 μm to 80 μm. The material of the adhesive film layer 2 is selected from the following several materials: modified epoxy resins, acrylic acids, modified rubbers or modified thermoplastic polyimides. It can be understood that in order to ensure the good conductivity of the shielding layer 1, the shielding layer 1 includes one or more of a metal shielding layer, a carbon nano tube shielding layer, a ferrite shielding layer and a graphene shielding layer. In addition, the metal shielding layer includes a monometallic shielding layer and/or an alloy shielding layer, wherein the monometallic shielding layer is made of any one of aluminum, titanium, zinc, iron, nickel, chromium, cobalt, copper, silver and gold, and the alloy shielding layer is made of any two or more of aluminum, titanium, zinc, iron, nickel, chromium, cobalt, copper, silver and gold. It should be noted that as shown in FIG. 1, the thickness of the shielding layer 1 is a distance D1 between the highest point of the first surface 11 of the shielding layer 1 and the lowest point of the second surface, and the thickness of the adhesive film layer 2 is a distance D2 between the highest point and the lowest point of the adhesive film layer 2.

Preferably, the rolling degree (i.e., the distance between the highest point and the lowest point of the second surface) of the second surface is within a range of 0.1 μm to 30 μm.

The rolling degree of the second surface is set to be within the above-mentioned range, so that the puncture function of the shielding layer can be enhanced, it is ensured that interference charges in the shielding layer 1 are smoothly guided into the ground, and an interference source formed by gathering of the interference charges is avoided.

Preferably, a ratio of the thickness of the adhesive film layer to the sum of the rolling degree of the second surface and the height of the conductor particles is 0.5 to 2, so as to ensure sufficient puncture strength and adhesive holding capacity. In specific implementation, on the one hand, delamination and blister of board caused by insufficient adhesive holding capacity due to too small thickness of the adhesive film layer relative to the sum of the rolling degree of the second surface and the height of the conductor particles is prevented, and on the other hand, the phenomenon of grounding failure caused by insufficient puncture strength due to too small sum of the rolling degree of the second surface and the height of the conductor particles relative to the thickness of the adhesive film layer.

The conductor particle 121 includes one or more of a metal particle, a carbon nano tube particle and a ferrite particle. In addition, the metal particle includes a monometallic particle and/or an alloy particle, wherein the monometallic particle is made of any one of aluminum, titanium, zinc, iron, nickel, chromium, cobalt, copper, silver and gold, and the alloy particle is made of any two or more of aluminum, titanium, zinc, iron, nickel, chromium, cobalt, copper, silver and gold. It should be noted that the conductor particle 121 and the shielding layer 1 may be made of the same material or different materials.

Preferably, the EMI shielding film further includes a protective film layer, the protective film layer being arranged on a side, close to the first surface 11, of the shielding layer 1. The protective film layer achieves a protection function so as to ensure that the shielding layer 1 is not scratched and damaged during use, thereby maintaining the high shielding efficiency of the shielding layer 1. The protective film layer includes a PPS film layer, a PEN film layer, a polyester film layer, a polyimide film layer, a film layer formed by solidifying epoxy resin printing ink, a film layer formed by solidifying polyurethane printing ink, a film layer formed by solidifying modified acrylic resin, or a film layer formed by solidifying polyimide resin.

It should be noted that the shielding layer in the drawings of the present embodiment may be of a single-layer structure or a multi-layer structure. In addition, the shielding layer in the drawings of the present embodiment may be set to be latticed, foamed or the like according to actual production and application needs.

Figure 3:
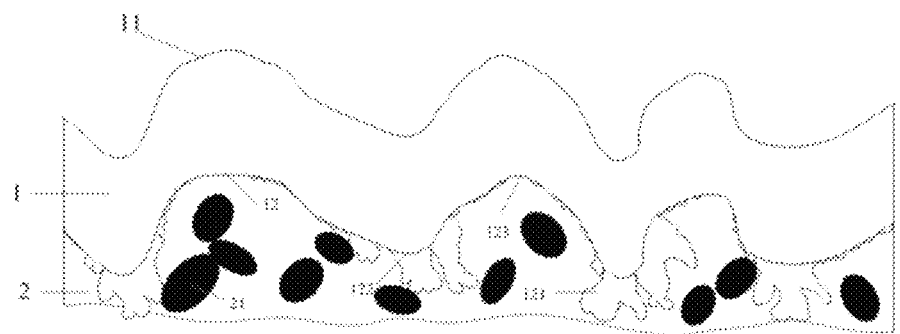
FIG. 3 is a structure diagram of an EMI shielding film in Embodiment 2 of the disclosure.

Referring to FIG. 3, a structure diagram of an EMI shielding film provided in Embodiment 2 of the disclosure is shown.

As shown in FIG. 3, the EMI shielding film includes a shielding layer 1 and an adhesive film layer 2, wherein the shielding layer 1 includes a first surface 11 and a second surface 12 opposite to each other; the second surface 12 is a rolling uneven surface; convex conductor particles 121 are also formed on the rolling uneven surface 12; the second surface 12 of the shielding layer 1 is provided with the adhesive film layer 2; and the adhesive film layer 2 includes an adhesion layer containing conductive particles 21. In specific implementation, as shown in FIG. 3, the shielding layer 1 may be first formed, and then the conductor particles 121 are formed on the second surface 12 of the shielding layer 1 by means of other processes. Of course, the shielding layer 1 and the conductor particles 121 may be of an integrated structure formed by a one-time forming process.

Preferably, the conductor particles 121 may be spaced from an outer surface of the adhesive film layer 2 by a certain distance, or may contact the outer surface of the adhesive film layer 2 or extend beyond the outer surface of the adhesive film layer 2. In addition, the outer surface of the adhesive film layer 2 may be a non-rolling even surface, or may be a gently-rolling uneven surface.

The first surface 11 of the shielding layer 1 may be a surface of any shape. For example, the first surface may be an even surface or may be a rolling uneven surface matched with the second surface 12 as shown in FIG. 3 or other rough surfaces. In the drawings of the disclosure, the first surface 11 is a rolling uneven surface matched with the second surface 12, and first surfaces of any other shapes fall within the scope of protection of the disclosure.

It should be noted that the shape of the conductor particles 121 as shown in FIG. 3 is only exemplary. Due to the difference in technological means and parameters, the conductor particles 121 may also be of other shapes such as clusters, hanging ice, stalactite or dendrite. In addition, the conductor particles 121 in the disclosure are not limited by the drawings and the above-mentioned shapes. Any conductor particles with puncture and conducting functions fall within the scope of protection of the disclosure.

It can be understood that the rolling uneven surface includes a plurality of protrusions 122 and recesses 123, the conductor particles 121 being preferably gathered on the protrusions 122. So, the shielding layer 1 is more likely to puncture the adhesive film layer 2 in a lamination process, thereby achieving reliable grounding and improving the quality of EMI shielding.

It should be noted that conductive particles 21 may be conductive particles 21 separated from each other, or may be large clustered conductive particles 21. When the conductive particles 21 are conductive particles 21 separated from each other, the electrical contact area can be further increased, and the electrical contact uniformity is improved. When the conductive particles 21 are large clustered conductive particles 21, the puncture strength can be increased.

Compared with Embodiment 1, the adhesive film layer 2 of the EMI shielding film provided in the present embodiment includes an adhesion layer containing conductive particles 21, so the conductive particles 21 cooperate with convex conductor particles 121 on the rolling uneven surface 12 to puncture the adhesive film layer 2 to be matched with the shielding layer 1, reliable puncture grounding is achieved, and interference charges are quickly guided into a ground layer of a circuit board.

Preferably, the height of the conductor particles 121 is within a range of 0.1 μm to 30 μm.

The thickness of the shielding layer 1 is within a range of 0.1 μm to 45 μm, and the thickness of the adhesive film layer 2 is within a range of 1 μm to 80 μm. The material of the adhesive film layer 2 is selected from the following several materials: modified epoxy resins, acrylic acids, modified rubbers and modified thermoplastic polyimides, wherein the thickness of the shielding layer 1 is a distance between the highest point of the first surface 11 of the shielding layer 1 and the lowest point of the second surface, and the thickness of the adhesive film layer 2 is a distance between the highest point and the lowest point of the adhesive film layer 2. In addition, in order to ensure the good conductivity of the shielding layer 1, the shielding layer 1 includes one or more of a metal shielding layer, a carbon nano tube shielding layer, a ferrite shielding layer or a graphene shielding layer.

In addition, the metal shielding layer includes a monometallic shielding layer and/or an alloy shielding layer, wherein the monometallic shielding layer is made of any one of aluminum, titanium, zinc, iron, nickel, chromium, cobalt, copper, silver and gold, and the alloy shielding layer is made of any two or more of aluminum, titanium, zinc, iron, nickel, chromium, cobalt, copper, silver and gold.

Preferably, the rolling degree (i.e., the distance between the highest point and the lowest point of the second surface) of the second surface is within a range of 0.1 μm to 30 μm. The rolling degree of the second surface is set to be within the above-mentioned range, so that the puncture function of the shielding layer can be enhanced, it is ensured that interference charges in the shielding layer 1 are smoothly guided into the ground, and an interference source formed by gathering of the interference charges is avoided.

Preferably, a ratio of the thickness of the adhesive film layer to the sum of the rolling degree of the second surface and the height of the conductor particles is 0.5 to 2, so as to ensure sufficient puncture strength and adhesive holding capacity. In specific implementation, on the one hand, delamination and blister of board caused by insufficient adhesive holding capacity due to too small thickness of the adhesive film layer relative to the sum of the rolling degree of the second surface and the height of the conductor particles is prevented, and on the other hand, the phenomenon of grounding failure caused by insufficient puncture strength due to too small sum of the rolling degree of the second surface and the height of the conductor particles relative to the thickness of the adhesive film layer.

The conductor particle 121 includes one or more of a metal particle, a carbon nano tube particle or a ferrite particle. In addition, the metal particle includes a monometallic particle and/or an alloy particle, wherein the monometallic particle is made of any one of aluminum, titanium, zinc, iron, nickel, chromium, cobalt, copper, silver or gold, and the alloy particle is made of any two or more of aluminum, titanium, zinc, iron, nickel, chromium, cobalt, copper, silver or gold. It should be noted that the conductor particle 121 and the shielding layer 1 may be made of the same material or different materials.

Preferably, the EMI shielding film further includes a protective film layer, the protective film layer being arranged on a side, close to the first surface 11, of the shielding layer 1. The protective film layer achieves a protection function so as to ensure that the shielding layer 1 is not scratched and damaged during use, thereby maintaining the high shielding efficiency of the shielding layer 1. The protective film layer includes a PPS film layer, a PEN film layer, a polyester film layer, a polyimide film layer, a film layer formed by solidifying epoxy resin printing ink, a film layer formed by solidifying polyurethane printing ink, a film layer formed by solidifying modified acrylic resin, or a film layer formed by solidifying polyimide resin.

It should be noted that the shielding layer in the drawings of the present embodiment may be of a single-layer structure or a multi-layer structure. In addition, the shielding layer in the drawings of the present embodiment may be set to be latticed, foamed or the like according to actual production and application needs.

Figure 4:
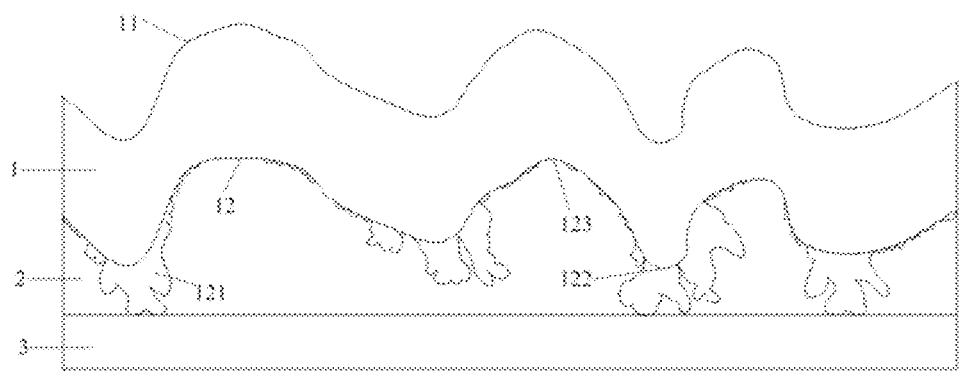
FIG. 4 is a structure diagram of a circuit board in Embodiment 3 of the disclosure.
Figure 5:
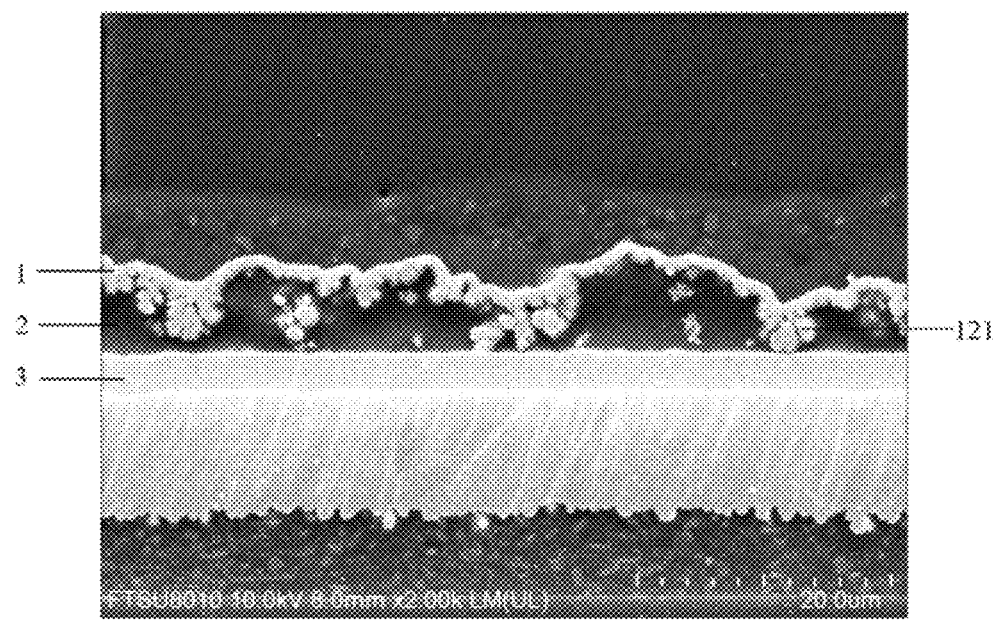
FIG. 5 is an electron micrograph of a circuit board in Embodiment 3 of the disclosure.

Referring to FIG. 4 and FIG. 5, a structure diagram and an electron micrograph of a circuit board provided in Embodiment 3 of the disclosure are shown. The circuit board includes a printed circuit board 3 and an EMI shielding film. The EMI shielding film includes a shielding layer 1 and an adhesive film layer 2, wherein the shielding layer 1 includes a first surface 11 and a second surface 12 opposite to each other; the second surface 12 is a rolling uneven surface; convex conductor particles 121 are also formed on the rolling uneven surface 12; the second surface 12 of the shielding layer is provided with the adhesive film layer 2; the adhesive film layer 2 includes an adhesion layer not containing conductive particles; the EMI shielding film is laminated with the printed circuit board 3 through the adhesive film layer 2; and the conductor particles 121 on the second surface 12 of the shielding layer 1 puncture the adhesive film layer 2 and extend to a ground layer of the printed circuit board 3. In specific implementation, as shown in FIG. 4, the shielding layer 1 may be first formed, and then the conductor particles 121 are formed on the second surface 12 of the shielding layer 1 by means of other processes. Of course, the shielding layer 1 and the conductor particles 121 may be of an integrated structure formed by a one-time forming process.

Preferably, the conductor particles 121 may be spaced from an outer surface of the adhesive film layer 2 by a certain distance, or may contact the outer surface of the adhesive film layer 2 or extend beyond the outer surface of the adhesive film layer 2. In addition, the outer surface of the adhesive film layer 2 may be a non-rolling even surface, or may be a gently-rolling uneven surface.

The first surface 11 of the shielding layer 1 may be a surface of any shape. For example, the first surface may be an even surface or may be a rolling uneven surface matched with the second surface 12 as shown in FIG. 4 or other rough surfaces. In the drawings of the disclosure, the first surface 11 is a rolling uneven surface matched with the second surface 12, and first surfaces of any other shapes fall within the scope of protection of the disclosure.

It should be noted that the shape of the conductor particles 121 as shown in FIG. 4 is only exemplary. Due to the difference in technological means and parameters, the conductor particles 121 may also be of other shapes such as clusters, hanging ice, stalactite or dendrite. In addition, the conductor particles 121 in the disclosure are not limited by the drawings and the above-mentioned shapes. Any conductor particles with puncture and conducting functions fall within the scope of protection of the disclosure.

It can be understood that the rolling uneven surface includes a plurality of protrusions 122 and recesses 123, the conductor particles 121 being preferably gathered on the protrusions 122. So, the shielding layer 1 is more likely to puncture the adhesive film layer 2 in a lamination process, thereby achieving reliable grounding and improving the quality of EMI shielding.

Preferably, the printed circuit board 3 is one of a flexible single-side board, a flexible double-side board, a flexible multi-layer board and a rigid combined board.

By means of the above-mentioned structure, in a lamination process, the adhesive film layer 2 is punctured by using the conductor particles 121 of the shielding layer 1, so at least part of the second surface 12 is connected to the ground layer of the printed circuit board 3. Thus, interference charges in the shielding layer 1 are guided into the ground, thereby avoiding influence on normal operation of the circuit board caused by forming of an interference source due to gathering of the interference charges. Moreover, the adhesive film layer 2 is an adhesion layer not containing conductive particles, so that the insertion loss of the circuit board during use can be reduced, the shielding efficiency is improved, and the bending performance of the circuit board is improved.

Preferably, the height of the conductor particles 121 is within a range of 0.1 µm to 30 µm.

The thickness of the shielding layer 1 is within a range of 0.1 µm to 45 µm, and the thickness of the adhesive film layer 2 is within a range of 1 µm to 80 µm. The material of the adhesive film layer 2 is selected from the following several materials: modified epoxy resins, acrylic acids, modified rubbers or modified thermoplastic polyimides. In addition, in order to ensure the good conductivity of the shielding layer 1, the shielding layer 1 includes one or more of a metal shielding layer, a carbon nano tube shielding layer, a ferrite shielding layer or a graphene shielding layer. In addition, the metal shielding layer includes a monometallic shielding layer and/or an alloy shielding layer, wherein the monometallic shielding layer is made of any one of aluminum, titanium, zinc, iron, nickel, chromium, cobalt, copper, silver and gold, and the alloy shielding layer is made of any two or more of aluminum, titanium, zinc, iron, nickel, chromium, cobalt, copper, silver and gold. It should be noted that the thickness of the shielding layer 1 is a distance between the highest point of the first surface 11 of the shielding layer 1 and the lowest point of the second surface, and the thickness of the adhesive film layer 2 is a distance between the highest point and the lowest point of the adhesive film layer 2.

Figure 6:
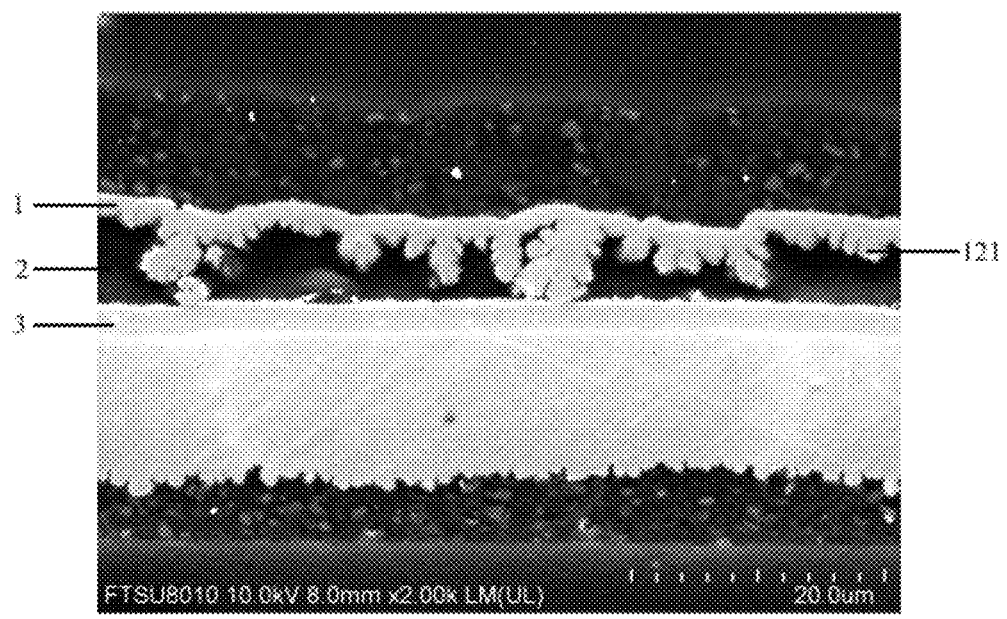
FIG. 6 is an electron micrograph of another circuit board in Embodiment 3 of the disclosure.

Preferably, the rolling degree (i.e., the distance between the highest point and the lowest point of the second surface) of the second surface is within a range of 0.1 µm to 30 µm. The rolling degree of the second surface is set to be within the above-mentioned range, so that the puncture function of the shielding layer can be enhanced, it is ensured that interference charges in the shielding layer 1 are smoothly guided into the ground, and an interference source formed by gathering of the interference charges is avoided. An electron micrograph of another circuit board according to an embodiment of the disclosure is shown in FIG. 6. From the figure, it can be seen that the second surfaces of the shielding layers in FIG. 5 and FIG. 6 have different rolling degrees, and the rolling degree of the second surface in FIG. 5 is greater than the rolling degree of the second surface in FIG. 6. However, conductor particles with a certain height grow on the second surfaces of the shielding layers on two circuit boards, the puncture strength can be enhanced, and reliable grounding can be achieved.

Preferably, a ratio of the thickness of the adhesive film layer to the sum of the rolling degree of the second surface and the height of the conductor particles is 0.5 to 2, so as to ensure sufficient puncture strength and adhesive holding capacity. In specific implementation, on the one hand, delamination and blister of board caused by insufficient adhesive holding capacity due to too small thickness of the adhesive film layer relative to the sum of the rolling degree of the second surface and the height of the conductor particles is prevented, and on the other hand, the phenomenon of grounding failure caused by insufficient puncture strength due to too small sum of the rolling degree of the second surface and the height of the conductor particles relative to the thickness of the adhesive film layer.

The conductor particle 121 includes one or more of a metal particle, a carbon nano tube particle and a ferrite particle. In addition, the metal particle includes a monometallic particle and/or an alloy particle, wherein the monometallic particle is made of any one of aluminum, titanium, zinc, iron, nickel, chromium, cobalt, copper, silver and gold, and the alloy particle is made of any two or more of aluminum, titanium, zinc, iron, nickel, chromium, cobalt, copper, silver and gold. It should be noted that the conductor particle 121 and the shielding layer 1 may be made of the same material or different materials.

Preferably, the EMI shielding film further includes a protective film layer, the protective film layer being arranged on a side, close to the first surface 11, of the shielding layer 1. The protective film layer achieves a protection function so as to ensure that the shielding layer 1 is not scratched and damaged during use, thereby maintaining the high shielding efficiency of the shielding layer 1. The protective film layer includes a PPS film layer, a PEN film layer, a polyester film layer, a polyimide film layer, a film layer formed by solidifying epoxy resin printing ink, a film layer formed by solidifying polyurethane printing ink, a film layer formed by solidifying modified acrylic resin, or a film layer formed by solidifying polyimide resin.

It should be noted that the shielding layer in the drawings of the present embodiment may be of a single-layer structure or a multi-layer structure. In addition, the shielding layer in the drawings of the present embodiment may be set to be latticed, foamed or the like according to actual production and application needs.

Figure 7:
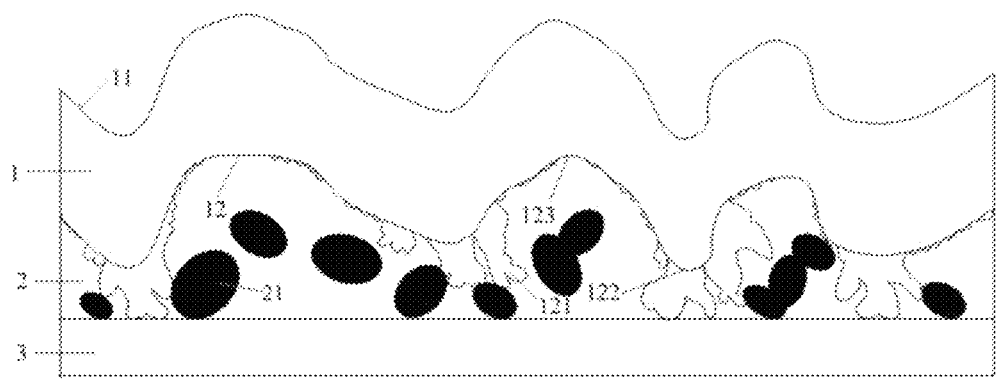
FIG. 7 is a structure diagram of a circuit board in Embodiment 4 of the disclosure.
Figure 8:
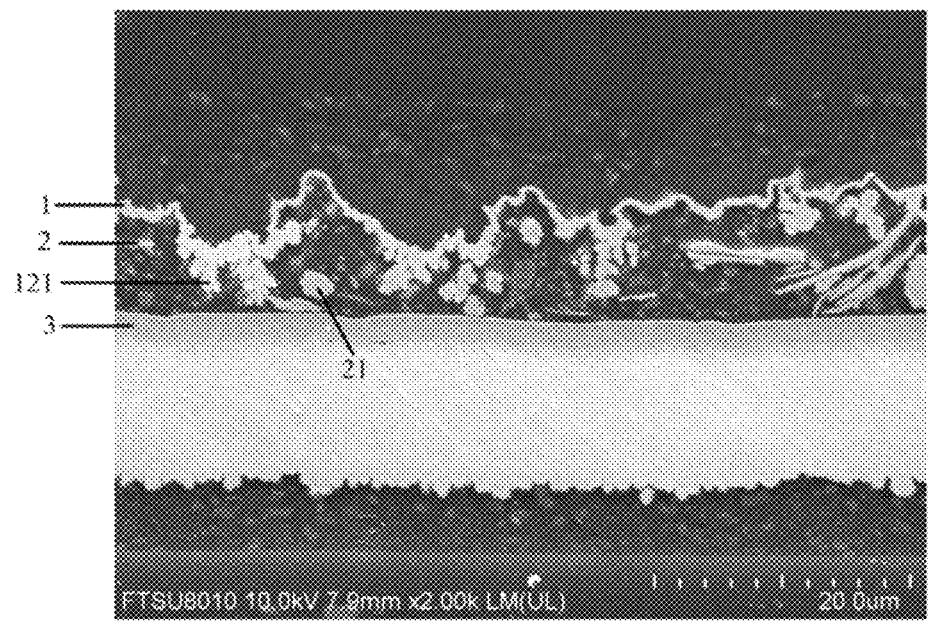
FIG. 8 is an electron micrograph of a circuit board in Embodiment 4 of the disclosure.

Referring to FIG. 7 and FIG. 8, a structure diagram and an electron micrograph of a circuit board provided in Embodiment 4 of the disclosure are shown. The circuit board includes a printed circuit board 3 and an EMI shielding film. The EMI shielding film includes a shielding layer 1 and an adhesive film layer 2, wherein the shielding layer 1 includes a first surface 11 and a second surface 12 opposite to each other; the second surface 12 is a rolling uneven surface; convex conductor particles 121 are also formed on the rolling uneven surface 12; the second surface 12 of the shielding layer is provided with the adhesive film layer 2; the adhesive film layer 2 includes an adhesion layer containing conductive particles 21; the EMI shielding film is laminated with the printed circuit board 3 through the adhesive film layer 2; and the conductor particles 121 on the second surface 12 of the shielding layer 1 puncture the adhesive film layer 2 and extend to a ground layer of the printed circuit board 3. In specific implementation, as shown in FIG. 7, the shielding layer 1 may be first formed, and then the conductor particles 121 are formed on the second surface 12 of the shielding layer 1 by means of other processes. Of course, the shielding layer 1 and the conductor particles 121 may be of an integrated structure formed by a one-time forming process.

Preferably, the conductor particles 121 may be spaced from an outer surface of the adhesive film layer 2 by a certain distance, or may contact the outer surface of the adhesive film layer 2 or extend beyond the outer surface of the adhesive film layer 2. In addition, the outer surface of the adhesive film layer 2 may be a non-rolling even surface, or may be a gently-rolling uneven surface.

The first surface 11 of the shielding layer 1 may be a surface of any shape. For example, the first surface may be an even surface or may be a rolling uneven surface matched with the second surface 12 as shown in FIG. 5 or other rough surfaces. In the drawings of the disclosure, the first surface 11 is a rolling uneven surface matched with the second surface 12, and first surfaces of any other shapes fall within the scope of protection of the disclosure.

It should be noted that the shape of the conductor particles 121 as shown in FIG. 7 is only exemplary. Due to the difference in technological means and parameters, the conductor particles 121 may also be of other shapes such as clusters, hanging ice, stalactite or dendrite. In addition, the conductor particles 121 in the disclosure are not limited by the drawings and the above-mentioned shapes. Any conductor particles with puncture and conducting functions fall within the scope of protection of the disclosure.

It can be understood that the rolling uneven surface includes a plurality of protrusions 122 and recesses 123, the conductor particles 121 being preferably gathered on the protrusions 122. So, the shielding layer 1 is more likely to puncture the adhesive film layer 2 in a lamination process, thereby achieving reliable grounding and improving the quality of EMI shielding.

It should be noted that conductive particles 21 may be conductive particles separated from each other, or may be large clustered conductive particles. When the conductive particles 21 are conductive particles separated from each other, the electrical contact area can be further increased, and the electrical contact uniformity is improved. When the conductive particles 21 are large clustered conductive particles, the puncture strength can be increased.

Preferably, the printed circuit board 3 is one of a flexible single-side board, a flexible double-side board, a flexible multi-layer board and a rigid combined board.

By means of the above-mentioned structure, in a lamination process, the adhesive film layer 2 is punctured by using the conductor particles 121 of the shielding layer 1, so at least part of the second surface 12 is connected to the ground layer of the printed circuit board 3. Thus, interference charges in the shielding layer 1 are guided into the ground, thereby avoiding influence on normal operation of the circuit board caused by forming of an interference source due to gathering of the interference charges. Moreover, the adhesive film layer 2 is an adhesion layer containing conductive particles 21, so the conductive particles 21 cooperate with convex conductor particles 121 on the rolling uneven surface 12 to puncture the adhesive film layer 2 to be matched with the shielding layer 1, reliable puncture grounding is achieved, and interference charges are quickly guided into a ground layer of a circuit board.

Preferably, the height of the conductor particles 121 is within a range of 0.1 µm to 30 µm.

The thickness of the shielding layer 1 is within a range of 0.1 µm to 45 µm, and the thickness of the adhesive film layer 2 is within a range of 1 µm to 80 µm. The material of the adhesive film layer 2 is selected from the following several materials: modified epoxy resins, acrylic acids, modified rubbers or modified thermoplastic polyimides. In addition, in order to ensure the good conductivity of the shielding layer 1, the shielding layer 1 includes one or more of a metal shielding layer, a carbon nano tube shielding layer, a ferrite shielding layer or a graphene shielding layer. In addition, the metal shielding layer includes a monometallic shielding layer and/or an alloy shielding layer, wherein the monometallic shielding layer is made of any one of aluminum, titanium, zinc, iron, nickel, chromium, cobalt, copper, silver and gold, and the alloy shielding layer is made of any two or more of aluminum, titanium, zinc, iron, nickel, chromium, cobalt, copper, silver and gold. It should be noted that the thickness of the shielding layer 1 is a distance between the highest point of the first surface 11 of the shielding layer 1 and the lowest point of the second surface, and the thickness of the adhesive film layer 2 is a distance between the highest point and the lowest point of the adhesive film layer 2. Preferably, the rolling degree (i.e., the distance between the highest point and the lowest point of the second surface) of the second surface is within a range of 0.1 µm to 30 µm. The rolling degree of the second surface is set to be within the above-mentioned range, so that the puncture function of the shielding layer can be enhanced, it is ensured that interference charges in the shielding layer 1 are smoothly guided into the ground, and an interference source formed by gathering of the interference charges is avoided.

Figures 9, 10:
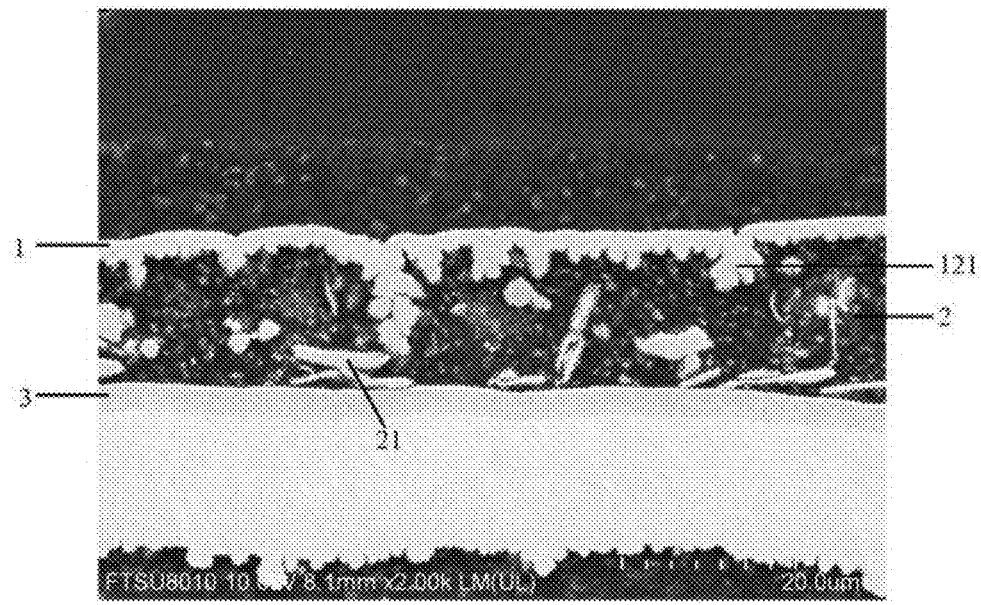
FIG. 9 is an electron micrograph of another circuit board in Embodiment 4 of the disclosure.
FIG. 10 is a flowchart of a preparation method for an EMI shielding film provided in Embodiment 5 of the disclosure.

An electron micrograph of another circuit board according to an embodiment of the disclosure is shown in FIG. 9. From the figure, it can be seen that the second surfaces of the shielding layers in FIG. 8 and FIG. 9 have different rolling degrees, and the rolling degree of the second surface in FIG. 8 is greater than the rolling degree of the second surface in FIG. 9. However, conductor particles with a certain height grow on the second surfaces of the shielding layers on two circuit boards, the puncture strength can be enhanced, and reliable grounding can be achieved.

Preferably, a ratio of the thickness of the adhesive film layer to the sum of the rolling degree of the second surface and the height of the conductor particles is 0.5 to 2, so as to ensure sufficient puncture strength and adhesive holding capacity. In specific implementation, on the one hand, delamination and blister of board caused by insufficient adhesive holding capacity due to too small thickness of the adhesive film layer relative to the sum of the rolling degree of the second surface and the height of the conductor particles is prevented, and on the other hand, the phenomenon of grounding failure caused by insufficient puncture strength due to too small sum of the rolling degree of the second surface and the height of the conductor particles relative to the thickness of the adhesive film layer.

The conductor particle 121 includes one or more of a metal particle, a carbon nano tube particle and a ferrite particle. In addition, the metal particle includes a monometallic particle and/or an alloy particle, wherein the monometallic particle is made of any one of aluminum, titanium, zinc, iron, nickel, chromium, cobalt, copper, silver and gold, and the alloy particle is made of any two or more of aluminum, titanium, zinc, iron, nickel, chromium, cobalt, copper, silver and gold. It should be noted that the conductor particle 121 and the shielding layer 1 may be made of the same material or different materials. Preferably, the EMI shielding film further includes a protective film layer, the protective film layer being arranged on a side, close to the first surface 11, of the shielding layer 1. The protective film layer achieves a protection function so as to ensure that the shielding layer 1 is not scratched and damaged during use, thereby maintaining the high shielding efficiency of the shielding layer 1. The protective film layer includes a PPS film layer, a PEN film layer, a polyester film layer, a polyimide film layer, a film layer formed by solidifying epoxy resin printing ink, a film layer formed by solidifying polyurethane printing ink, a film layer formed by solidifying modified acrylic resin, or a film layer formed by solidifying polyimide resin.

It should be noted that the shielding layer in the drawings of the present embodiment may be of a single-layer structure or a multi-layer structure. In addition, the shielding layer in the drawings of the present embodiment may be set to be latticed, foamed or the like according to actual production and application needs.

Referring to FIG. 10, a flowchart of a preparation method for an EMI shielding film provided in Embodiment 5 of the disclosure is shown. The method is applied to preparation of the EMI shielding film according to any one of the above-mentioned contents, and includes the following steps.

S1. A shielding layer is formed, wherein the shielding layer includes a first surface and a second surface opposite to each other, and the second surface is a rolling uneven surface.

S2. Conductor particles are formed on the rolling uneven surface of the shielding layer.

In S2, conductor particles are formed on the rolling uneven surface of the shielding layer by means of one or more processes of physical roughening, chemical plating, physical vapor deposition, chemical vapor deposition, evaporation plating, splutter plating, electroplating and mixed plating.

S3. An adhesive film layer is formed on the second surface of the shielding layer.

In S3, the second surface of the shielding layer is directly coated with an adhesive film layer so as to form the adhesive film layer on the second surface of the shielding layer. In addition, a release film is coated with an adhesive film layer, and then the adhesive film layer is laminated and transferred to the second surface of the shielding layer so as to form the adhesive film layer on the second surface of the shielding layer.

In S1, the shielding layer may be formed by means of the following manners:

Manner (1): a protective film layer is formed on a carrier film, and a shielding layer is formed on the protective film layer, wherein the first surface is laminated with the protective film layer; and Manner (2): a shielding layer is formed on the surface of a peelable layer with a carrier, a protective film layer is formed on the shielding layer, and the peelable layer with a carrier is peeled, wherein a first surface of the shielding layer is laminated with the protective film layer.

When the shielding layer is formed by means of Manner (1), the second surface of the shielding layer may be a rolling uneven surface by means of the following two manners:

Manner i: a shielding layer is formed on an even surface or uneven surface of the protective film layer, and the shielding surface is subjected to surface treatment by means of one or more processes of physical roughening, chemical plating, physical vapor deposition, chemical vapor deposition, evaporation plating, splutter plating, electroplating and mixed plating, wherein when Manner i is adopted, regardless of the surface state of the protective film layer, the shielding surface is subjected to surface treatment by means of one or more processes of physical roughening, chemical plating, physical vapor deposition, chemical vapor deposition, evaporation plating, splutter plating, electroplating and mixed plating, so the second surface of the shielding layer is a rolling uneven surface; and Manner ii: a shielding layer with a certain rolling degree is formed on an uneven surface of the protective film layer, wherein when Manner ii is adopted, the rolling degree of the protective film layer may be controlled by controlling the dimension and proportion of filler during preparation of the protective film layer, so that the protective film layer has an uneven surface with a certain rolling degree. Then, a shielding layer is formed on the uneven surface of the protective film layer, so that the shielding layer has a certain rolling degree, and the second surface is a rolling uneven surface.

When the shielding layer is formed by means of Manner (2), the second surface of the shielding layer may be a rolling uneven surface by means of the following two manners:

Manner iii: a shielding layer is formed on an even surface or uneven surface of the peelable layer with a carrier, and the shielding surface is subjected to surface treatment by means of one or more processes of physical roughening, chemical plating, physical vapor deposition, chemical vapor deposition, evaporation plating, splutter plating, electroplating and mixed plating, wherein when Manner iii is adopted, regardless of the surface state of the peelable layer with a carrier, the shielding surface is subjected to surface treatment by means of one or more processes of physical roughening, chemical plating, physical vapor deposition, chemical vapor deposition, evaporation plating, splutter plating, electroplating and mixed plating, so the second surface of the shielding layer is a rolling uneven surface; and Manner iv: a shielding layer with a certain rolling degree is formed on an uneven surface of the peelable layer with a carrier, wherein when Manner iv is adopted, the surface rolling degree of the peelable layer with a carrier is controlled, so that the shielding layer formed on the uneven surface of the peelable layer with a carrier has a certain rolling degree, and the second surface is a rolling uneven surface.

To sum up, the embodiments of the disclosure provide an EMI shielding film, a circuit board, and a preparation method for an EMI shielding film. The EMI shielding film includes a shielding layer and an adhesive film layer, wherein the shielding layer includes a first surface and a second surface opposite to each other; the second surface is a rolling uneven surface; convex conductor particles are also formed on the rolling uneven surface; and the second surface of the shielding layer is provided with the adhesive film layer, so the adhesive film layer of the EMI shielding film will extrude adhesive materials into recesses of the second surface in a lamination process, the adhesive holding capacity is increased, and delamination and blister of board is unlikely to occur. Moreover, the rolling uneven surface also has conductor particles with a certain height, so it can be ensured that the shielding layer smoothly punctures the adhesive film layer in the lamination process, reliable grounding is achieved, and the practicality is strong.

The above description is a preferred implementation manner of the disclosure. It should be noted that those of ordinary skill in the art may also make some improvements and modifications without departing from the principle of the disclosure. These improvements and modifications fall within the scope of protection of the disclosure.

What is claimed is:

1. An Electromagnetic Interference (EMI) shielding film, comprising a shielding layer and an adhesive film layer, wherein the shielding layer comprises a first surface and a second surface opposite to each other; the second surface is a rolling uneven surface; convex conductor particles are also formed on the rolling uneven surface; and the second surface of the shielding layer is provided with the adhesive film layer;

wherein the conductor particles on the second surface of the shielding layer puncture the adhesive film layer and extend to ground.

2. The EMI shielding film is according to claim 1, wherein the height of the conductor particles is within a range of 0.1 µm to 30 µm.

3. The EMI shielding film is according to claim 2, wherein the thickness of the shielding layer is within a range of 0.1 µm to 45 µm, and the thickness of the adhesive film layer is within a range of 1 µm to 80 µm.

4. The EMI shielding film is according to claim 3, the EMI shielding film further comprising a protective film layer, the protective film layer being formed on the first surface of the shielding layer.

5. The EMI shielding film is according to claim 1, wherein the rolling uneven surface of the shielding layer comprises a plurality of protrusions and recesses, the conductor particles being gathered on the protrusions.

6. The EMI shielding film is according to claim 5, the EMI shielding film further comprising a protective film layer, the protective film layer being formed on the first surface of the shielding layer.

7. The EMI shielding film is according to claim 5, the EMI shielding film further comprising a protective film layer, the protective film layer being formed on the first surface of the shielding layer.

8. The EMI shielding film is according to claim 1, wherein the adhesive film layer comprises an adhesion layer containing conductive particles.

9. The EMI shielding film is according to claim 1, wherein the adhesive film layer comprises an adhesion layer not containing conductive particles.

10. The EMI shielding film is according to claim 1, wherein the shielding layer comprises one or more of a metal shielding layer, a carbon nano tube shielding layer, a ferrite shielding layer and a graphene shielding layer.

11. The EMI shielding film is according to claim 10, wherein the metal shielding layer comprises a monometallic shielding layer and/or an alloy shielding layer, wherein the monometallic shielding layer is made of any one of aluminum, titanium, zinc, iron, nickel, chromium, cobalt, copper, silver and gold, and the alloy shielding layer is made of any two or more of aluminum, titanium, zinc, iron, nickel, chromium, cobalt, copper, silver and gold.

12. The EMI shielding film is according to claim 1, the EMI shielding film further comprising a protective film layer, the protective film layer being formed on the first surface of the shielding layer.

13. A circuit board, comprising a printed circuit board and an Electromagnetic Interference (EMI) shielding film as claimed in any one of claims 1 to 12, wherein the EMI shielding film is laminated with the printed circuit board through an adhesive film layer of the EMI shielding film; and conductor particles on a second surface of the shielding layer puncture the adhesive film layer and extend to a ground layer of the printed circuit board.

14. A preparation method for an Electromagnetic Interference (EMI) shielding film used for preparing the EMI shielding film as claimed in any one of claims 1 to 12, comprising the following steps:
    S1. forming a shielding layer, wherein the shielding layer comprises a first surface and a second surface opposite to each other, and the second surface is a rolling uneven surface;
    S2. forming conductor particles on the rolling uneven surface of the shielding layer; and
    S3. forming an adhesive film layer on the second surface of the shielding layer.

15. The preparation method for an EMI shielding film is according to claim 14, wherein the shielding layer is formed in S1 by means of the following manners:
    forming a protective film layer on a carrier film, and forming a shielding layer on the protective film layer, wherein the first surface close to the protective film layer; or,
    forming a shielding layer on the surface of a peelable layer with a carrier, forming a protective film layer on the shielding layer, and peeling the peelable layer with a carrier, wherein a first surface of the shielding layer close to the protective film layer.

16. The preparation method for an EMI shielding film is according to claim 15, wherein forming a shielding layer on the protective film layer or the peelable layer with a carrier specifically comprises:
    forming a shielding layer on an even surface or uneven surface of the protective film layer or the peelable layer with a carrier, and performing surface treatment on the shielding surface by means of one or more processes of physical roughening, chemical plating, physical vapor deposition, chemical vapor deposition, evaporation plating, splutter plating, electroplating or mixed plating; or, forming a shielding layer with a certain rolling degree on an uneven surface of the protective film layer or the peelable layer with a carrier.

17. The preparation method for an EMI shielding film is according to claim 16, wherein forming conductor particles on the rolling uneven surface of the shielding layer in S2 specifically comprises:

forming conductor particles on the rolling uneven surface of the shielding layer by means of one or more processes of physical roughening, chemical plating, physical vapor deposition, chemical vapor deposition, evaporation plating, splutter plating, electroplating and mixed plating.

18. The preparation method for an EMI shielding film is according to claim 15, wherein forming conductor particles on the rolling uneven surface of the shielding layer in S2 specifically comprises:

forming conductor particles on the rolling uneven surface of the shielding layer by means of one or more processes of physical roughening, chemical plating, physical vapor deposition, chemical vapor deposition, evaporation plating, splutter plating, electroplating and mixed plating.

19. The preparation method for an EMI shielding film is according to claim 14, wherein forming conductor particles on the rolling uneven surface of the shielding layer in S2 specifically comprises:

forming conductor particles on the rolling uneven surface of the shielding layer by means of one or more processes of physical roughening, chemical plating, physical vapor deposition, chemical vapor deposition, evaporation plating, splutter plating, electroplating and mixed plating.

20. The preparation method for an EMI shielding film is according to claim 14, wherein forming an adhesive film layer on the second surface of the shielding layer in S3 specifically comprises:

coating an adhesive film layer on release film, and then laminating and transferring the adhesive film layer to the second surface of the shielding layer so as to form the adhesive film layer on the second surface of the shielding layer; or, directly coating an adhesive film layer on the second surface of the shielding layer so as to form the adhesive film layer on the second surface of the shielding layer.

\* \* \* \* \*